(12) United States Patent
Luttrell

(10) Patent No.: US 6,887,630 B2
(45) Date of Patent: May 3, 2005

(54) METHOD AND APPARATUS FOR FRACTURING POLYGONS ON MASKS USED IN AN OPTICAL LITHOGRAPHY PROCESS

(75) Inventor: Bruce Luttrell, San Jose, CA (US)

(73) Assignee: Numerical Technologies, San Jose, CA (US)

( * ) Notice: Subject to any disclaimer, the term of this patent is extended or adjusted under 35 U.S.C. 154(b) by 215 days.

(21) Appl. No.: 10/412,172

(22) Filed: Apr. 10, 2003

(65) Prior Publication Data
US 2004/0205687 A1 Oct. 14, 2004

(51) Int. Cl.[7] .......................... G03F 9/00; G03F 17/50; G06F 17/50
(52) U.S. Cl. ................ 430/5; 430/30; 716/19; 716/20; 716/21
(58) Field of Search ................ 430/5, 30; 716/19, 716/20, 21

(56) References Cited

U.S. PATENT DOCUMENTS 5,885,734 A * 3/1999 Pierrat et al. ................ 716/19
5,943,487 A * 8/1999 Messerman et al. .......... 716/11
6,470,489 B1 * 10/2002 Chang et al. .................. 430/5

* cited by examiner

Primary Examiner—Christopher G. Young
(74) Attorney, Agent, or Firm—Park, Vaughan & Fleming LLP

(57) ABSTRACT

A system for fracturing polygons on masks used in lithography processes for manufacturing an integrated circuit is described. The system fractures polygons that include cavities in either the horizontal edges or the vertical edges by examining the aspect ratio (length/width) of prospective slices made at each vertex of the polygon. After determining the aspect ratio of each prospective slice, the system selects the slice with the lowest aspect ratio and slices the polygon into two sub-polygons. Slicing the polygon in this manner effectively eliminates "slivers" or slices with extreme aspect ratios. This process is continued until each sub-polygon is either a rectangle or a trapezoid that can be printed by electron beam photolithography.

20 Claims, 6 Drawing Sheets

METHOD AND APPARATUS FOR FRACTURING POLYGONS ON MASKS USED IN AN OPTICAL LITHOGRAPHY PROCESS

BACKGROUND

1. Field of the Invention

The invention relates to the process of fabricating integrated circuits. More specifically, the invention relates to a method and an apparatus for fracturing polygons on masks used in an optical lithography process for fabricating integrated circuits.

2. Related Art

Recent advances in integrated circuit technology have largely been accomplished by decreasing the feature size of circuit elements on a semiconductor chip. As the feature size of these circuit elements continues to decrease, circuit designers are forced to deal with problems that arise as a consequence of the optical lithography process that is typically used to manufacture integrated circuits. This optical lithography process begins with the formation of a photoresist layer on the surface of a semiconductor wafer. A mask composed of opaque regions, which are generally formed of chrome, and light-transmissive clear regions, which are generally formed of quartz, is then positioned over this photoresist layer. (Note that the term "mask" as used in this specification is meant to include the term "reticle.") Light is then shone on the mask from a visible light source, an ultraviolet light source, or more generally some type of electromagnetic radiation source together with suitably adapted masks and lithography equipment.

This image is reduced and focused through an optical system containing a number of lenses, filters, and mirrors. The light passes through the clear regions of the mask and exposes the underlying photoresist layer. At the same time, opaque regions of the mask block the light leaving underlying portions of the photoresist layer unexposed.

The exposed photoresist layer is then developed, through chemical removal of either the exposed or non-exposed regions of the photoresist layer. The end result is a semiconductor wafer with a photoresist layer having a desired pattern. This pattern can then be used for etching underlying regions of the wafer.

The masks used to expose the photoresist layer are typically processed by an optical proximity correction (OPC) process to alleviate problems cause by the diffraction of the exposure radiation at the feature edges, and over-etching of the photoresist at the ends of the features. The OPC process adds elements such as serifs and hammerheads to the original polygons. These added elements (and some of the original polygons) can cause problems during the mask writing process because the mask writing equipment can typically print only rectangles and trapezoids. Hence, after the OPC process, mask features are typically "fractured" so that each exposure element is a rectangle or a trapezoid.

For example, FIG. 1A illustrates a polygon 102 with serifs 103 that have been added by the OPC process. Since polygon 102 is not a rectangle or a trapezoid, a fracturing process is performed on polygon 102 to slice polygon 102 into rectangles and trapezoids. This fracturing process occurs because of limitations within the mask writing equipment.

FIG. 1B illustrates a cut that is made during the process of fracturing a polygon into rectangles and trapezoids. During the fracturing process, a cut 104 from a vertex 105 is considered in an attempt to eliminate the cavity 107 in polygon 102. However, this cut is rejected because it creates a "sliver" 106, which is too small to be printed easily.

In an attempt to fracture the polygon into rectangles without creating slivers, designers developed a fracturing process that determines the smaller width of the two resulting shapes on each side of the slice. The system considers at all possible slices from a vertex in this way and selects the slice that produces the greatest smaller width. For example, FIG. 1C illustrates a slice 108 that is made using this technique. Note that the slice 108 is made instead of the sliver 106 in FIG. 1B because the width of resulting shape 109 is larger than the width of sliver 106 made by cut 104 illustrated in FIG. 1. This slicing technique eliminates the slivers. However, slicing the polygon 102 lengthwise in this way fractures critical dimension 112 into multiple rectangles, which can create registration problems during the multiple exposures required to expose the mask blank. This gives rise to unwanted variations in the critical dimension 112. Additionally, since some of the rectangles are relatively long, multiple exposures (shots) may be required to expose these rectangles.

A sliver is a rectangle or a trapezoid whose minimum width is below a user-defined threshold. The polygon-fracturing algorithm targets "shaped beam" electron photolithography, where the mask is exposed by photographic equipment, which directs the beam through a keyhole aperture. If this aperture is too narrow, the exposure will be less successful than normal. Machine parameters dictate what this minimum aperture width; any shape which falls below this minimum aperture width is termed a "sliver."

Hence, what is needed is a method and an apparatus for fracturing polygons used in an optical lithography process without the problems described above.

SUMMARY

One embodiment of the invention provides a system for fracturing polygons on masks used in an optical lithography process for manufacturing an integrated circuit. The system operates by first receiving a mask layout to be used in fabricating the integrated circuit, wherein the mask layout includes a polygon that defines a desired feature on the integrated circuit, and wherein the polygon is either x-convex or y-convex, but not both x-convex and y-convex. Convexity is defined below in conjunction with FIG. 2. For a given vertex on the polygon, the system calculates an aspect ratio for each possible slice that extends from the vertex, wherein the aspect ratio for a slice is the slice length divided by the smaller of the two resulting widths on each side of the slice. The system then selects the slice with the smallest aspect ratio. Next, the system applies the slice with the smallest aspect ratio to the polygon. In this way the system avoids slices that create extreme aspect ratios.

In a variation of this embodiment, the system receives the mask layout after an OPC process has been applied to the mask layout.

In a variation of this embodiment, the system repeats the steps of calculating the aspect ratio, selecting the smallest aspect ratio, and applying the slice until each remaining polygon is a rectangle or a trapezoid.

In a further variation, the system first considers slices that originate from cavity corner vertices.

In a further variation, if the vertex is within a cavity between two serifs on corners of a line end, the system also considers a "roof cut" slice that separates the serifs and part of the line end from the rest of the line.

In a further variation, if a slice width is less that a pre-specified minimum width, the system reports a violation.

In a further variation, a critical dimension of the desired feature is not sliced.

DEFINITIONS

Sliver: a rectangle or a trapezoid whose minimum width is below a user-defined threshold.

DETAILED DESCRIPTION

Introduction

The mask data preparation, or colloquially fracturing, process occurs at the end of the electronic design automation (EDA) process to "tape out" the mask data for mask writing machines. Improvements to the fracturing technique can result in enhanced masks and ultimately improved semiconductors and chips. The invention will be described as follows. A mask layout is examined to locate polygons that are exclusively x-convex or y-convex. The aspect ratio is then calculated for each possible slice at a vertex of the polygon, and the slice with the lowest aspect ratio is selected. Selecting the slice with the lowest aspect ratio produces sub-polygons that are "short" and "fat." This process avoids slices with extreme aspect ratios (i.e., "long," "skinny" slices). After this slice has been applied, the process is repeated for the next vertex until each sub-polygon is either a rectangle or a trapezoid.

Convex Polygons

One embodiment of the present invention seeks to apply cuts to polygons that are either x-convex or y-convex, but not both. Note that other polygons that are both x-convex and y-convex, or are neither x-convex nor y-convex can be fractured using other techniques.

Figure 1C:
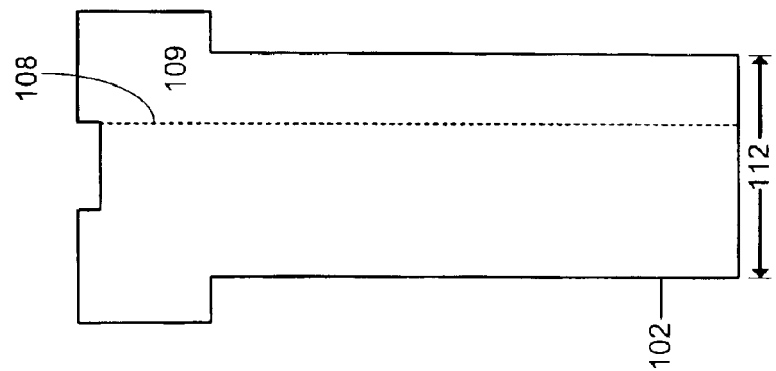
FIG. 1C illustrates another possible slice applied to the polygon illustrated in FIG. 1A.
Figure 1B:
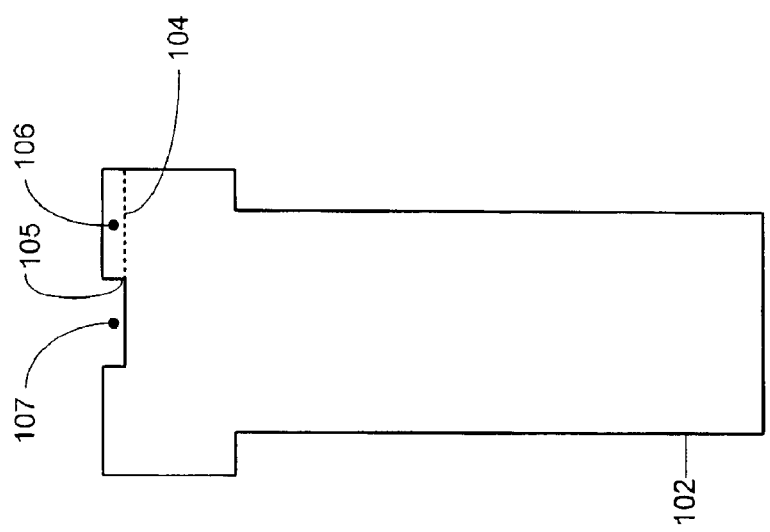
FIG. 1B illustrates a slice applied to the polygon illustrated in FIG. 1A.
Figure 1A:
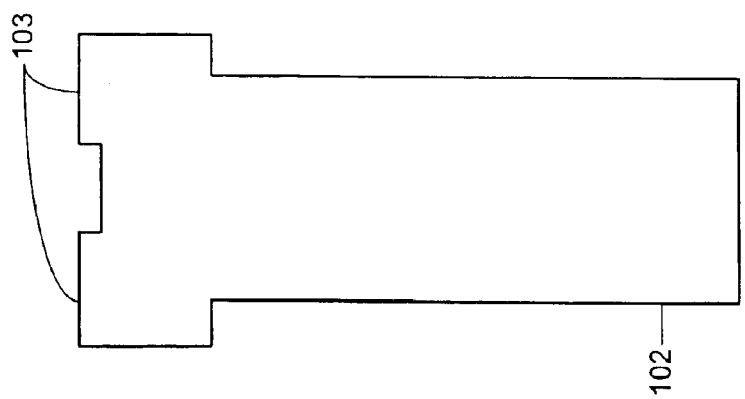
FIG. 1A illustrates a polygon with serifs.
Figure 2:
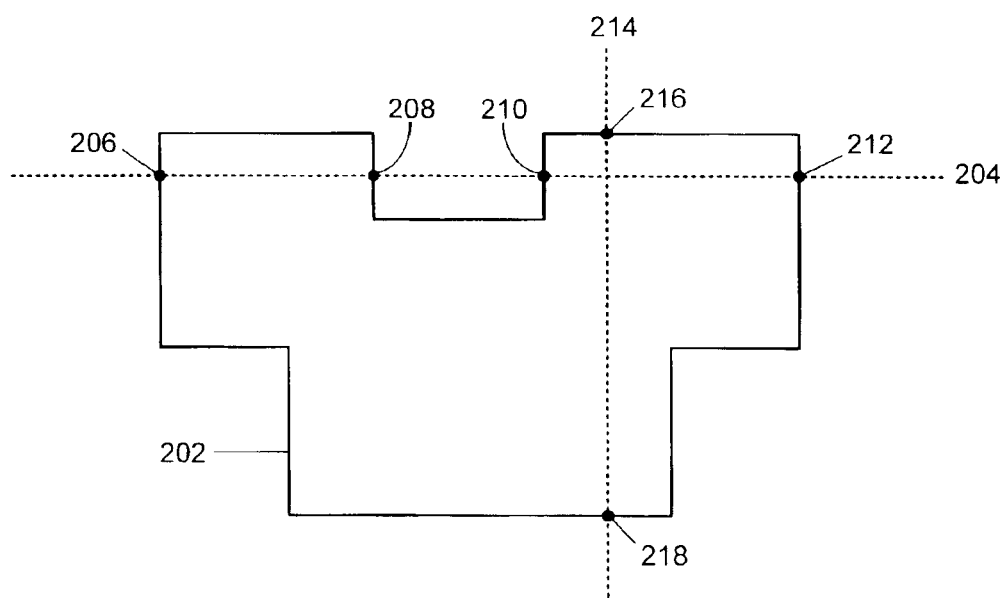
FIG. 2 illustrates an exemplary y-convex polygon in accordance with an embodiment of the invention.

FIG. 2 illustrates an exemplary y-convex polygon in accordance with an embodiment of the invention. Polygon 202 is y-convex because any possible vertical line 214 enters and exits polygon 202 only once. Line 214 enters polygon 202 at point 216 and exits polygon 202 at point 218. Moving line 214 left or right from the position shown in FIG. 2 to any other point passing through polygon 202 will still yield a single entry point and a single exit point for line 214. Since polygon 202 meets this condition, it is y-convex.

Polygon 202, however, is not x-convex because line 204 enters and exits polygon 202 twice in some positions. As shown in FIG. 2, line 204 enters polygon 202 at point 206, exits at point 208, enters at point 210, and exits at point 212. However, the polygon 202 rotated 90° once either left or right would be an x-convex polygon.

Calculating Aspect Ratio

Figure 3C:
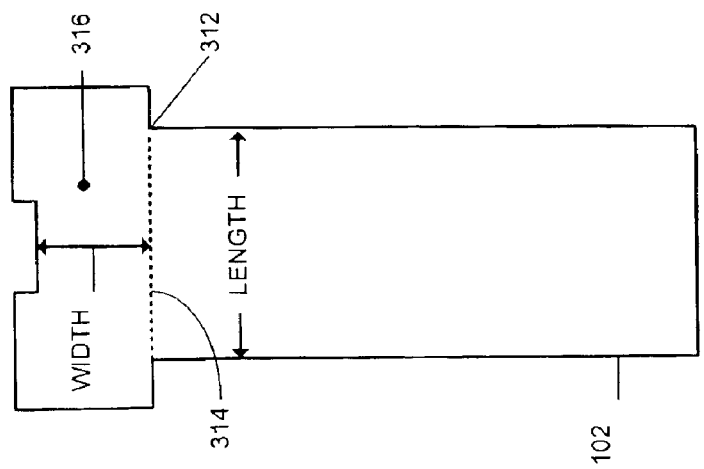
FIG. 3C illustrates measurements obtained to compute the aspect ratio for a roof cut in accordance with an embodiment of the invention.
Figure 3B:
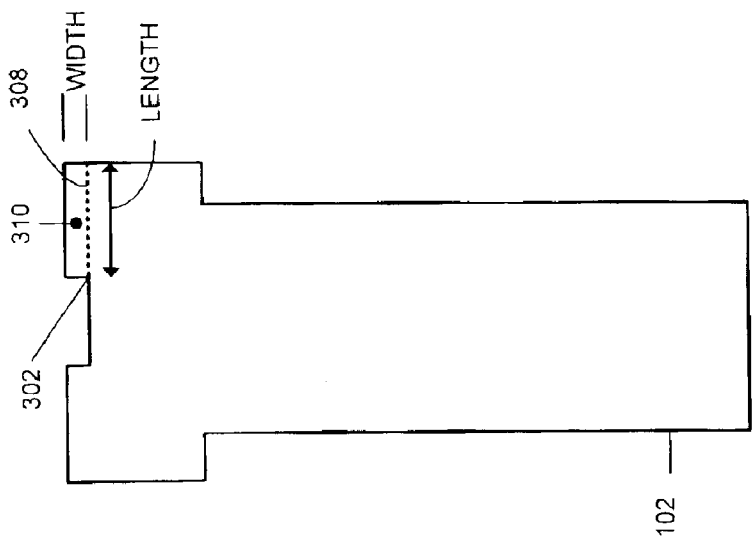
FIG. 3B illustrates measurements obtained to compute the aspect ratio for a substitute cut in accordance with an embodiment of the invention.
Figure 3A:
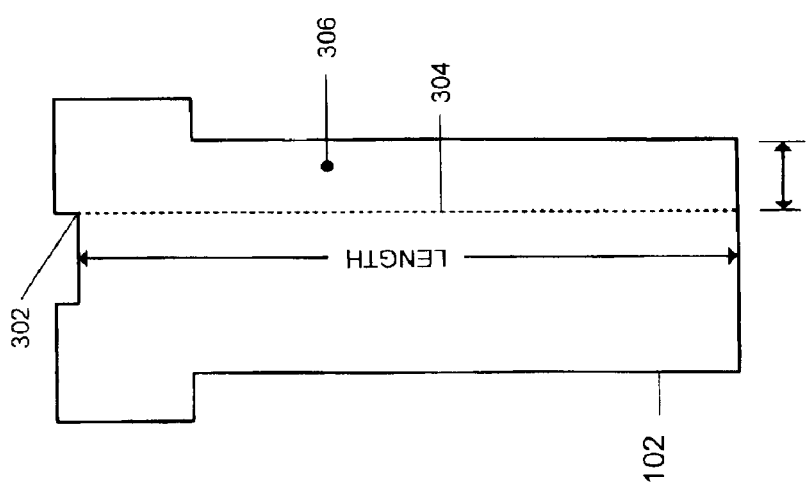
FIG. 3A illustrates measurements obtained to compute the aspect ratio for a normal cut in accordance with an embodiment of the invention.

FIG. 3A illustrates measurements obtained to compute the aspect ratio for a perpendicular cut 304 in accordance with an embodiment of the invention. The system starts by considering a vertex 302. Note that in one embodiment of the present invention, the system considers vertices associated with cavity corners, such as vertex 302 prior to considering other vertices. Two possible cuts originate from vertex 302—a "normal cut" and a "substitute cut." Perpendicular cut 304 creates slice 306 and the system calculates the aspect ratio for slice 306 by dividing the length of slice 306 by the smaller of the two resulting widths on either side of the slice. The smaller of the two resulting widths is chosen because the smaller width is closer to the sliver width. The smaller width, therefore, will eventually result in the generation of the smaller rectangle or trapezoid whose width is of concern if it is below the sliver width.

FIG. 3B illustrates measurements obtained to compute the aspect ratio for a substitute cut in accordance with an embodiment of the invention. Parallel cut 308 creates slice 310. Before making this cut, the system calculates the aspect ratio for slice 310 by dividing the length of slice 310 by the smaller width on either side of slice 310.

FIG. 3C illustrates measurements obtained to compute the aspect ratio for a roof cut in accordance with an embodiment of the invention. In order to make roof cut 314, the system locates vertex 312 on the same side of the polygon as vertex 302. Roof cut 314 is then made on polygon 102 creating slice 316. The system then calculates the aspect ratio for slice 316. After examining the aspect ratios for slices 306, 310, and 316, the system chooses the slice with the lowest aspect ratio to apply to polygon 102. This can also be viewed as selecting the cut that results in the slice with the lowest aspect ratio. For the polygon 102 illustrated in FIGS. 3A–C, the chosen slice is slice 316 created by the roof cut 314.

Final Cuts

Figure 4A:
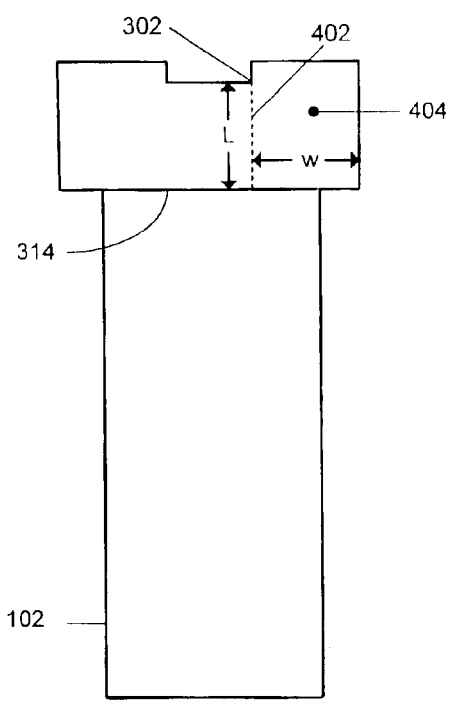
FIG. 4A illustrates the process of considering a normal cut in the upper sub-polygon after the roof cut has been applied in accordance with an embodiment of the invention.

FIG. 4A illustrates the process of considering a normal cut in the upper sub-polygon after the roof cut has been applied in accordance with an embodiment of the invention. Specifically, the cavity of the original polygon 102 remains in the slice 316 and the slice must still be decomposed into rectangles and trapezoids. Therefore, the system has to work through the vertices of the slice 316 and select cuts using an aspect-ratio dependent decision making process analogous to the one described in connection with FIGS. 3A–C. Here, cut 402 from vertex 302 creating slice 404 is selected to help eliminate the cavity and convert the slice to rectangles and trapezoids. This selection is made after comparing the aspect ratio of slice 404 with the recomputed aspect ratio for the slice 310 in the context of slice 316.

Figure 4B:
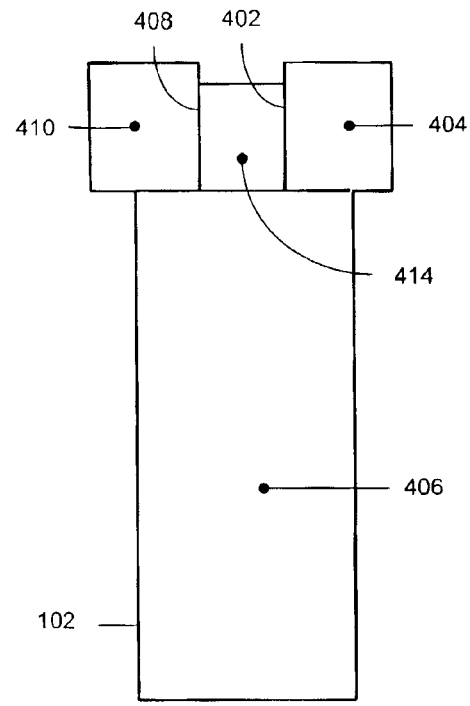
FIG. 4B illustrates additional cuts in accordance with an embodiment of the invention.

FIG. 4B illustrates additional cuts in accordance with an embodiment of the invention. The system continues with cuts from the cavity vertices until the cavity is eliminated. Cut 408 is applied from the other vertex of the cavity creating slices 410 and 414. Since all of the slices of polygon 102 are now either rectangles or trapezoids, the process is complete. Note that this process eliminates the long "normal" slices along the critical dimension of polygon 102.

Slicing a Polygon

Figure 5:
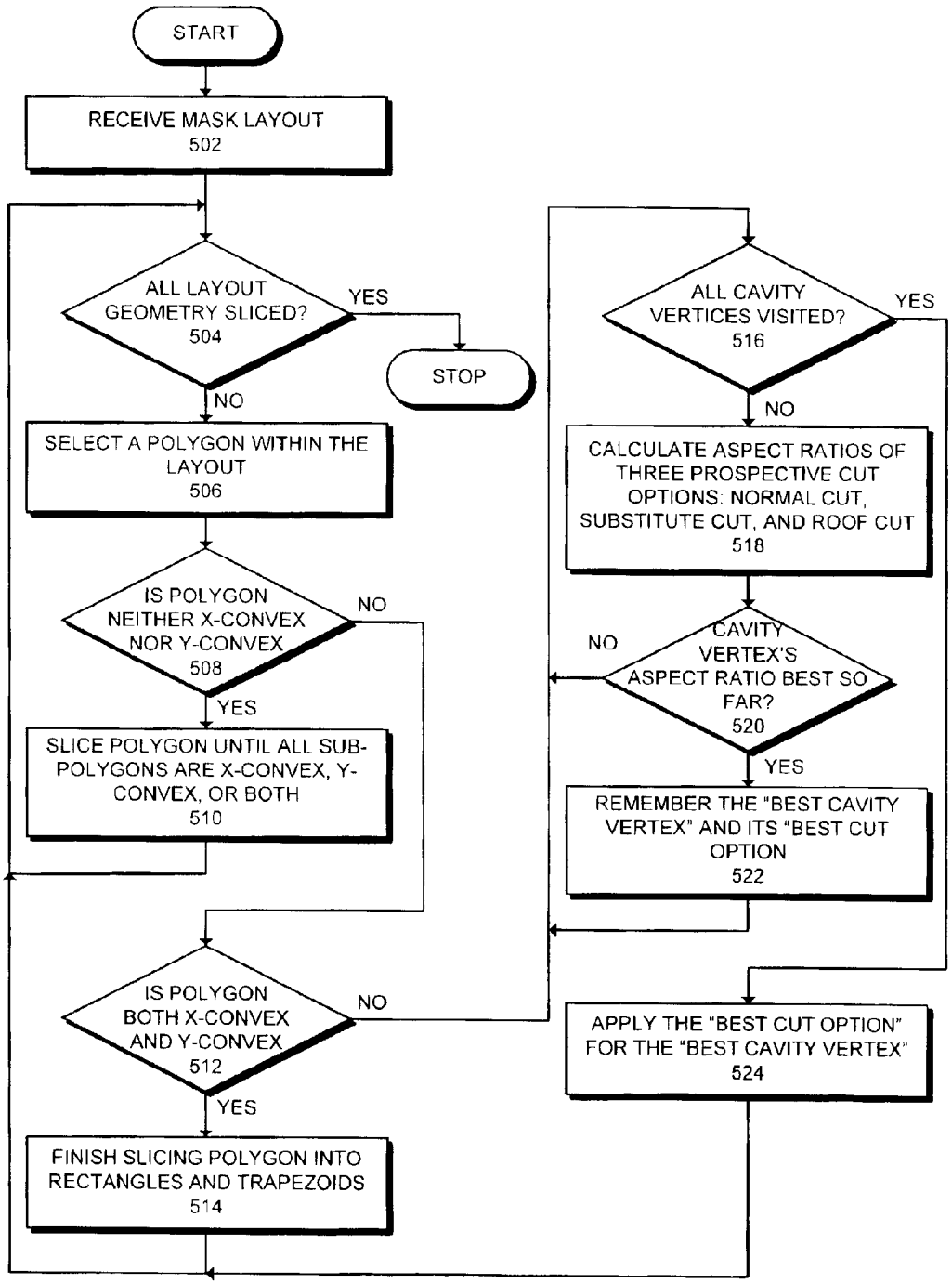
FIG. 5 presents a flowchart illustrating the process of slicing a polygon in accordance with an embodiment of the invention.

FIG. 5 presents a flowchart illustrating the process of slicing a polygon in accordance with an embodiment of the invention. The system starts when a mask layout is received after an optional optical proximity correction (OPC) operation has been applied to the mask layout (step 502). In some embodiments the layout is received in a GDS-II format. In other embodiments, the layout is stored in a Milkyway database format and step 502 includes accessing the database during the process of FIG. 5. Still other formats can be used for the layout data, e.g. OpenAccess, etc. Next, the system determines if all layout geometry has been sliced (step 504). If so, the process is terminated.

If all layout geometry has not been sliced, the system selects a polygon from within the layout (step 508). Next, the system determines if the polygon is neither x-convex nor y-convex (step 508). If so, the system continues to slice the polygon until al sub-polygons are x-convex, y-convex, or both (step 510). The process then returns to step 504 to determine if all layout geometry has been sliced.

If the polygon is neither x-convex nor y-convex at step 508, the system determines if the polygon is both x-convex and y-convex (step 512). If so, the system finishes slicing the polygon into rectangles and trapezoids (step 514). The process then returns to step 504 to determine if all layout geometry has been sliced.

If the polygon is not both x-convex and y-convex at step 512, the polygon is either x-convex or y-convex. In this case, the system then determines if all cavity vertices have been visited (step 516). If not, the system calculates the aspect ratios of the three prospective cut options—the normal cut, the substitute cut, and the roof cut—at a vertex remembering the "best cut option" for this vertex (Step 518). Next, the system determines if this cavity vertex's aspect is the best so far (step 520). If not, the process returns to step 516 to determine if all cavity vertices have been visited.

If this cavity vertex's aspect is the best so far at step 520, the system remembers the "best cavity vertex" and its "best cut option" (step 522). The process then returns to step 516 to determine if all cavity vertices have been visited. When all cavity vertices have been visited at step 516, the system applies the "best cut option" for the "best cavity vertex" (step 524). The process then returns to step 504 to determine if all layout geometry has been sliced.

EXAMPLE

Figure 6A:
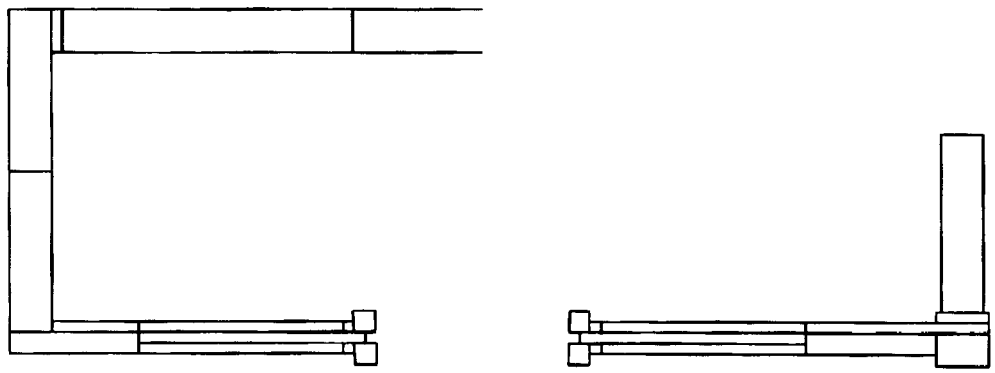
FIG. 6A illustrates an exemplary fracturing of a layout using existing techniques.
Figure 6B:
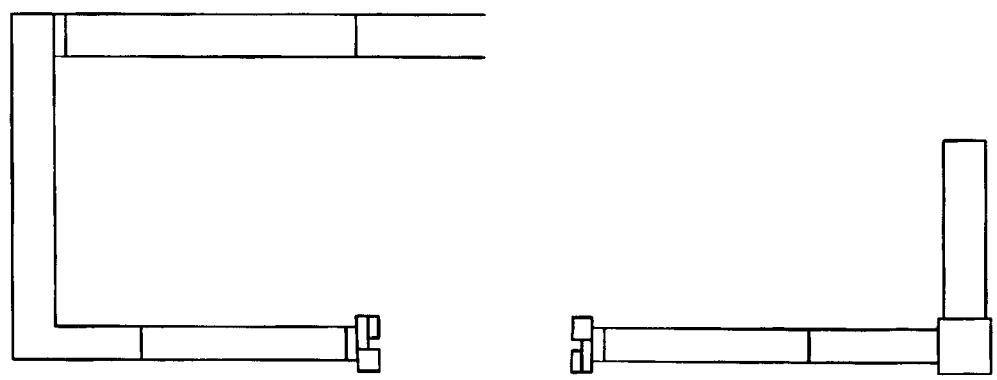
FIG. 6B illustrates an exemplary fracturing of the same layout as in FIG. 6A using a technique that considers the aspect ratios generated by each slice in accordance with an embodiment of the present invention.

FIG. 6A illustrates an exemplary fracturing of a layout using an existing technique. In contrast, FIG. 6B illustrates an exemplary fracturing of the same layout using a technique that considers the aspect ratios generated by each slice in accordance with an embodiment of the present invention and makes use of roof cuts. Note that the existing technique fractures some of the wires lengthwise, which can cause critical dimension problems, whereas the new technique does not because it considers aspect ratios. Note also that this technique can be applied to any polygon that is x-convex or y-convex, but not to polygons that are both or neither x-convex and y-convex.

CONCLUSION

The foregoing description is presented to enable one to make and use the invention, and is provided in the context of a particular application and its requirements. It is not intended to be exhaustive or to limit the invention to the forms disclosed. Various modifications to the disclosed embodiments will be readily apparent, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein. Accordingly, many modifications and variations will be apparent. The scope of the invention is defined by the appended claims.

The data structures and code described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet. For example, embodiments of the invention can include mask data preparation software that implements the processes of FIG. 5 accessed across a network. In some embodiments, the invention can be implemented as an alternate to existing fracturing algorithms in mask data preparation software. For example, the CATS™ software from Synopsys, Inc., Mountain View, Calif., could be support the processes described.

Note that the invention can be applied to any type of lithographic process for fabricating semiconductor chips, including processes that make use of, deep-ultraviolet (DUV) radiation, extreme ultraviolet (EUV) radiation, X-rays, and electron beams, along with suitably modified masks.

What is claimed is:

1. A method for fracturing polygons on masks used in an optical lithography process for manufacturing an integrated circuit, comprising:

receiving a mask layout to be used in fabricating the integrated circuit, wherein the mask layout includes a polygon that defines a desired feature on the integrated circuit, and wherein the polygon is x-convex or y-convex and wherein the polygon includes a plurality of vertices;

calculating an aspect ratio for each possible slice that extends from a given vertex in the plurality of vertices, wherein the aspect ratio for a slice is the slice length divided by a smaller of two resulting widths on either side of the slice;

selecting the slice with a smallest aspect ratio; and applying the slice with the smallest aspect ratio to the polygon, wherein selecting the slice with the smallest aspect ratio avoids slices that create extreme aspect ratios.

2. The method of claim 1, wherein receiving the mask layout further comprises receiving the mask layout after OPC has been applied to the mask layout.

3. The method of claim 1, further comprising repeating the steps of calculating the aspect ratio, selecting the smallest aspect ratio, and applying the slice until the polygon is sliced such that each sub-polygon is a rectangle or a trapezoid.

4. The method of claim 1, wherein the method further comprises considering slices that originate from cavity corner vertices.

5. The method of claim 4, wherein if the given vertex is within a cavity between two serifs on corners of a line end, the method further considers a "roof cut" slice that separates these two serifs and part of the line end from a remainder of the line.

6. The method of claim 1, wherein if a slice width is less that a pre-specified minimum width thereby creating a sliver, the method further comprises reporting a violation.

7. The method of claim 1, wherein a critical dimension of the desired feature is not cut.

8. A computer-readable storage medium storing instructions that when executed by a computer cause the computer to perform a method for fracturing polygons on masks used in an optical lithography process for manufacturing an integrated circuit, the method comprising:

receiving a mask layout to be used in fabricating the integrated circuit, wherein the mask layout includes a polygon that defines a desired feature on the integrated circuit, and wherein the polygon is x-convex or y-convex and wherein the polygon includes a plurality of vertices;

calculating an aspect ratio for each possible slice that extends from a given vertex in the plurality of vertices, wherein the aspect ratio for a slice is the slice length divided by a smaller of two resulting widths on either side of the slice;

selecting the slice with a smallest aspect ratio; and applying the slice with the smallest aspect ratio to the polygon, wherein selecting the slice with the smallest aspect ratio avoids slices that create extreme aspect ratios.

9. The computer-readable storage medium of claim 8, wherein receiving the mask layout further comprises receiving the mask layout after OPC has been applied to the mask layout.

10. The computer-readable storage medium of claim 8, the method further comprising repeating the steps of calculating the aspect ratio, selecting the smallest aspect ratio, and applying the slice until the polygon is sliced such that each sub-polygon is a rectangle or a trapezoid.

11. The computer-readable storage medium of claim 8, wherein the method further comprises considering slices that originate from cavity corner vertices.

12. The computer-readable storage medium of claim 11, wherein if the given vertex is within a cavity between two serifs on corners of a line end, the method further considers a "roof cut" slice that separates these two serifs and part of the line end from a remainder of the line.

13. The computer-readable storage medium of claim 8, wherein if a slice width is less that a pre-specified minimum width thereby creating a sliver, the method further comprises reporting a violation.

14. The computer-readable storage medium of claim 8, wherein a critical dimension of the desired feature is not cut.

15. A mask having structures that were fractured for use in an optical lithography process for manufacturing an integrated circuit:

wherein the mask to be used in fabricating the integrated circuit includes a polygon that defines a desired feature on the integrated circuit, and wherein the polygon is x-convex or y-convex but not both x-convex and y-convex; and wherein the polygon has been sliced so that slivers are not created by:

calculating an aspect ratio for each possible slice that extends from a given vertex, wherein the aspect ratio for a slice is the slice length divided by a smaller of two resulting widths on either side of the slice, selecting the slice with a smallest aspect ratio, and applying the slice with the smallest aspect ratio to the polygon, wherein selecting the slice with the smallest aspect ratio avoids slices that create extreme aspect ratios.

16. The mask of claim 15, wherein the mask has received OPC corrections.

17. The mask of claim 15, wherein the polygon has been fractured so that each sub-polygon is a rectangle or a trapezoid.

18. The mask of claim 15, wherein if a vertex on the polygon is within a cavity between two serifs on corners of a line end, the polygon has been cut by a "roof cut" slice that separates these serifs and part of the line end from a remainder of the line.

19. The mask of claim 18, wherein the "roof cut" slice is positioned at a vertex that is not associated with a cavity.

20. The mask of claim 15, wherein a critical dimension of the desired feature is not sliced.

* * * * *